United States Patent
McAdam et al.

(10) Patent No.: US 7,293,055 B2
(45) Date of Patent: Nov. 6, 2007

(54) FLEXIBLE ADAPTATION ENGINE FOR ADAPTIVE TRANSVERSAL FILTERS

(75) Inventors: Matthew W. McAdam, Vancouver (CA); Andrew S. Wright, Vancouver (CA); Bill M. Lye, Coquitlam (CA)

(73) Assignee: PMC-Sierra, Inc., Santa Clara, CA (US)

( * ) Notice: Subject to any disclaimer, the term of this patent is extended or adjusted under 35 U.S.C. 154(b) by 800 days.

(21) Appl. No.: 10/725,183

(22) Filed: Dec. 1, 2003

(65) Prior Publication Data
US 2004/0199559 A1 Oct. 7, 2004

Related U.S. Application Data

(60) Provisional application No. 60/461,065, filed on Apr. 7, 2003.

(51) Int. Cl.
*G06F 17/10* (2006.01)
(52) U.S. Cl. ..................... 708/322
(58) Field of Classification Search ............. 708/322
See application file for complete search history.

(56) References Cited

U.S. PATENT DOCUMENTS

| | | | |
|---|---|---|---|
| 5,157,690 A | 10/1992 | Buttle | |
| 5,517,213 A | 5/1996 | Bhatt et al. | |
| 6,732,129 B1* | 5/2004 | Ashjaee | 708/322 |
| 6,957,240 B2* | 10/2005 | Awad et al. | 708/322 |
| 6,970,896 B2* | 11/2005 | Awad et al. | 708/322 |
| 7,103,177 B2* | 9/2006 | Tanrikulu et al. | 379/406.14 |
| 2004/0015529 A1* | 1/2004 | Tanrikulu et al. | 708/322 |
| 2006/0056496 A1* | 3/2006 | Smee et al. | 375/148 |

OTHER PUBLICATIONS

S.C. Douglas, "Adaptive Filters Employing Partial Updates," IEEE Transactions on Circuits Systems, vol. 44, No. 3, pp. 209-216, Mar. 1997.
J. Sonntag et al, "An Adaptive PAM-4 5Gb/s Backplane Transceiver in 0.25 um CMOS," IEEE 2002 Custom Integrated Circuits Conference, pp. 363-366 (2002).
V. Wolff, R. Gooch and J. Treichler, "Specification and Development of an Equalizer-Demodulator for Wideband Digital Microwave Radio Signals," Proc. IEEE Military Communications Conference, NY, Oct. 1988, pp. 461-467 (1988).

* cited by examiner

*Primary Examiner*—Tan V. Mai
(74) *Attorney, Agent, or Firm*—Knobbe Martens Olson & Bear LLP

(57) ABSTRACT

A flexible adaptation engine includes a coefficient adaptation circuit that implements multiple adaptation algorithms, and/or multiple coefficient selection algorithms, to adapt the filter coefficients of one or more digital filters, such as the transversal filters of a receiver. In one embodiment, a controller selects the filter coefficients to be adapted, and the adaptation algorithm(s) to be used to adapt the selected coefficients, based on various criteria such as convergence status data, clock recovery status signals, the current load on a processor that adapts the coefficients, and/or manual control signals. In one embodiment, the architecture supports the ability to vary the number of coefficients that are updated at a time, and to concurrently apply different adaptation algorithms to different subsets of filter coefficients. The flexible adaptation engine may be implemented in application-specific hardware and/or as a processor that executes software.

54 Claims, 9 Drawing Sheets

FLEXIBLE ADAPTATION ENGINE FOR ADAPTIVE TRANSVERSAL FILTERS

PRIORITY CLAIM

This application claims the benefit of U.S. provisional application No. 60/461,065, filed Apr. 7, 2003, the disclosure of which is hereby incorporated by reference.

BACKGROUND OF THE INVENTION

1. Field of the Invention

The present invention relates to communications systems that use digital filters. More specifically, the invention relates to adaptation circuits and methods for adjusting the filter coefficients of a transversal or other digital filter.

2. Description of the Related Art

Filtering is a common and powerful function that finds use in a large variety of applications. One important application is communications, in which information is sent from one place to another over a channel. A filter used to compensate for the effects of the channel is commonly referred to as an equalizer.

A major source of error in information transmission is inter-symbol interference (ISI), which arises when a signal is sent across a dispersive channel. Dispersive channels tend to spread the energy of a transmitted signal out over time, which means both past and future symbols can interfere with the current symbol.

To further illustrate this point, consider a transmitted signal, x[k], which is sent across a dispersive channel with impulse response h[k]. The received signal, y[k], is given by:

$$y[k] = \sum_n h[n]x[k-n] \qquad \text{Eqn 1}$$
$$= h[0]x[k] + \sum_{n<0} h[n]x[k-n] + \sum_{n>0} h[n]x[k-n]$$

The second term in equation 1 arises from the precursor component of the channel impulse response, and allows future symbols to interfere with the current symbol. The third term in equation 1 arises from the postcursor component of the channel impulse response, and allows previous symbols to interfere with the current symbol. Fortunately, equalization can be used to reduce or remove these components.

Oftentimes, one has no prior knowledge of the channel characteristics, making it difficult define the optimum filter. To overcome this problem, filters are often made adaptive, allowing them to "learn" the channel characteristics.

Adaptive Transversal Filters

The adaptive transversal filter is a fundamental component in adaptive equalization applications, and is a well understood non-recursive structure. Adaptive traversal filters commonly operate in the discrete time domain and have a finite impulse response (FIR). A generalized block diagram of a typical adaptive transversal filter 20 is shown in FIG. 1. For convenience, the input history and coefficients are expressed as vectors:

$$X_k = [x[k]\ x[k-1]\ \ldots\ x[k-N]]^T \qquad \text{Eqn 2}$$

$$W_k = [W_0[k]\ W_1[k]\ \ldots\ W_N[k]]^T \qquad \text{Eqn 3}$$

Coefficient adaptation is performed based on the desired response, d[k], and the filter output, y[k]. The desired response, d[k], is often a training (pilot) signal, which is essentially a copy of the transmitted sequence stored in the receiver, or the hard decisions of a Decision Feedback Equalizer (DFE). Commonly used adaptation algorithms attempt to minimize the mean-square error, $E[\epsilon_k^2]$, where the error signal is given by:

$$\epsilon_k = d[k] - y[k] = d[k] - W_k^T X_k \qquad \text{Eqn 4}$$

Expanding the square of the error signal gives:

$$\epsilon_k^2 = (d[k] - W_k^T X_k)^2 \qquad \text{Eqn 5}$$
$$= d[k]^2 + W_k^T X_k X_k^T W_k - 2d[k]X_k^T W_k$$

To produce a reasonably simplified expression for the mean-square error, the following assumptions may be made: (1) $W_k$ is fixed, and (2) $X_k$, d[k], and $\epsilon_k$ are statistically wide-sense stationary. With these assumptions, the mean-square error reduces to:

$$E[\epsilon_k^2] = E[d[k]^2] + W^T E[X_k X_k^T]W - 2E[d[k]X_k^T]W \qquad \text{Eqn 6}$$

The above equation reveals that the mean-square error is a quadratic function of the coefficient vector W. This quadratic function is referred to as the error surface, and it contains a global minimum at the optimal coefficient vector. The adaptation engine 22 attempts to "walk" the coefficients down the error surface to a point as close as possible to the optimal solution.

A variety of basic algorithms are available to converge the coefficient vector to the optimal solution, including but not limited to Newton's method, the steepest descent method, least-mean square (LMS), and recursive least squares (RLS). LMS is one of the most commonly used algorithms due to its ease of computation. The LMS algorithm achieves its simplicity by approximating the mean-square error, $E[\epsilon_k^2]$, with $\epsilon_k^2$, leading to the following coefficient update equation:

$$W_{k+1} = W_k + \mu \epsilon_k X_k \qquad \text{Eqn 7}$$

In the above equation, μ is a step-size scalar that can be used to control convergence rate and steady-state accuracy.

In the above exemplary description, the filter and associated algorithms operate on real-valued data. The extension to complex-valued data and coefficients is well known in the art and is included in the scope of the present disclosure. Similarly, in the exemplary description the optimal coefficient vector is chosen as the one that minimizes the mean square error between the filter output and the desired response.

Those skilled in the art will recognize that it may be advantageous to choose the optimal coefficient vector based on some criterion other than mean-square error. This results in forms of the coefficient updating equation that may differ significantly from equation 7. The present disclosure is not intended to limit the applicable scope of the invention to the exemplary description and is intended to include such techniques as may be utilized by those skilled in the art.

Local Minima on the Error Surface

Under certain circumstances, local minima can also exist on the error surface. Adaptation engines that become trapped on a local minimum provide a non-optimal coefficient vector, which reduces the effectiveness of the transversal filter. Local minima are typically caused by non-linear effects in the signal path, certain channel characteristics, or some combination of the two.

Blind Equalization

When the desired response, d[k], is unknown, adaptation may be performed in a blind mode. There are many algorithms capable of blindly converging an adaptive filter using higher-order statistics of the filter's input. Some prominent algorithms include Sato's algorithm and the Constant Modulus Algorithm (CMA).

Decision Feedback Equalizers

An alternative to the feedforward transversal filter, known as the Decision Feedback Equalizer (DFE), was originally proposed in 1967 and showed superior performance to its linear counterpart. DFEs were later modified to be adaptive. Adaptive DFEs typically use adaptive transversal filters 20 in both feedforward and feedback roles (although the feedforward transversal filter 20 is commonly omitted), as shown in FIG. 2.

The role of the feedforward section is to reduce the precursor component of the inter-symbol interference, while the feedback section reduces the post-cursor component. Traditional symbol-rate DFEs typically correct for precursor and post-cursor components spaced at integer multiples of the symbol period, T. For example, a DFE with N feedback taps can correct for post-cursor components that occur at intervals of T 2T, . . . , NT from the current symbol.

DFEs can be implemented in analog or digital form. Digital implementations use analog-to-digital conversion circuitry to convert the filter's input signal to digital form.

DFEs are often operated in a decision-directed mode, which uses the output of a decision device as the desired signal. In this case, the error signal is given by the difference between the decision device's output and input. This is advantageous, as it does not require a training signal to converge the adaptation engine, although convergence is inherently more difficult.

A block diagram for a decision-directed DFE is shown in FIG. 3. A common error signal and adaptation engine 22 are used to adapt both feedforward and feedback sections. The generation of this error signal can be challenging, as it is generally necessary to sample and hold, and then scale, the soft decisions (input of the decision device) before subtracting them from the hard decisions (output of the decision device). This allows the delay through the decision device to be accounted for, and also prevents the hard decisions from swamping the small signal level of the soft decisions.

3Fractionally Spaced Equalizers

Fractionally Spaced Equalizers (FSEs) are transversal equalizers (used as a linear equalizer or the feedforward portion of a DFE) whose taps are spaced at some fraction of the symbol period. A typical choice is T/2 spacing, which allows correction of both the in-phase instant and the quadrature instant in the channel impulse response.

For an ideal, jitter-free sampling clock, equalization of anything but the ideal in-phase sampling instant provides no improvement in performance. However, when a realistic, jittered clock is considered, the true sampling instant frequently varies from the ideal point. Because of this, there is an advantage to providing equalization across the entire symbol period. Thus in realistic systems, FSEs provide superior performance to symbol-rate equalizers.

Adaptation Engines

Adaptation engines 22 typically update the complete set of coefficients of the adaptive traversal filter 20 continuously. This has the advantage of providing the fastest possible convergence for a given algorithm. However, the number of operations performed by the adaptation engine 22 in a given period of time is generally directly proportional to the number of coefficients, N. For a large number of coefficients, these designs are therefore commonly inefficient and impractical.

Several designs have been proposed in which the coefficients are updated sequentially and/or in groups. Examples of such designs are set forth in the following references:

J. Sonntag, J. Stonick, J. Gorecki, et al., "An Adaptive PAM-4 5 Gb/s Backplane Transceiver in 0.25 um CMOS," IEEE 2002 Custom Integrated Circuits Conference, 2002, pp. (20-3-1)-(20-3-4).

V. Wolff, R. Gooch, and J. Treichler "Specification and development of an equalizer-demodulator for wideband digital microwave radio signals," Proc. IEEE Military Communications Conference, NY, October 1988.

S. Douglas, "Adaptive Filters Employing Partial Updates," IEEE Transactions on Circuits and Systems-II: Analog and Digital Signal Processing., Vol. 44, No. 3, pp. 209-216, March 1997.

U.S. Pat. Nos. 5,517,213 and 5,157,690.

These designs generally do not provide sufficient flexibility to optimally balance computational demands, steady-state accuracy, and start-up issues. An example of a start-up issue is the failure of an LMS engine to converge to the optimal set of coefficients due to a received signal with very low Signal to Noise Ratio (SNR).

SUMMARY OF THE INVENTION

The present invention comprises a flexible adaptation engine that includes a coefficient adaptation circuit that adapts the coefficients of a transversal filter, or other digital filter, using one or more adaptation algorithms, and a controller that controls the coefficient adaptation circuit. In a preferred embodiment, the controller selects the filter coefficients to be adapted, and optionally selects the adaptation algorithm(s) to be used to adapt the selected coefficients, based on one or more criteria. These criteria may include, for example, coefficient convergence status data, clock recovery status signals, bit error rate (BER) data, the current load on a processor that adapts the coefficients, information about the transversal filter's input signal, and/or manual control signals. Different numbers of filter coefficients may be adapted on different adaptation cycles.

The coefficient adaptation circuit may implement a plurality of different adaptation algorithms, in which case the controller may select between these adaptation algorithms to adapt the selected filter coefficients. In one embodiment, the architecture supports the ability to concurrently apply different adaptation algorithms to different subsets of filter coefficients.

The flexible adaptation engine may be implemented in application-specific hardware and/or as a processor that executes software. A single adaptation engine may be used on a time-shared basis to adapt the coefficients of multiple digital filters, including filters that operate in separate, independent communications channels. The invention also comprises an equalizer, such as a decision feedback equalizer or a fractionally spaced equalizer, having one or more adaptive transversal filters whose coefficients are adapted using the flexible adaptation engine.

DETAILED DESCRIPTION OF THE PREFERRED EMBODIMENTS

The present invention comprises a flexible adaptation engine design employing a coefficient selection algorithm that can balance the needs of computational demands, steady-state accuracy, and start-up issues. The ability to dynamically and flexibly select filter coefficients to be adapted allows the adaptation engine to address the time-varying nature of these separate needs. The design does not place any restrictions on the adaptation algorithm used to update the selected coefficients. In a preferred embodiment, multiple different adaptation algorithms are implemented by the flexible adaptation engine, and a selection process is used to select between these adaptation algorithms.

The flexible adaptation engine is preferably used to adapt the coefficients of a transversal filter 20. As will be recognized, the design may also be used to adapt coefficients and other parameters of other types of digital filters (including various classes of Finite Impulse Response and Infinite Impulse Response filters), and may be used to adapt parameters of other types of adaptable systems. A single flexible adaptation engine may be shared between multiple digital filters, including filters that operate in separate data transmission paths or channels, to further reduction computational demands.

Figure 4:
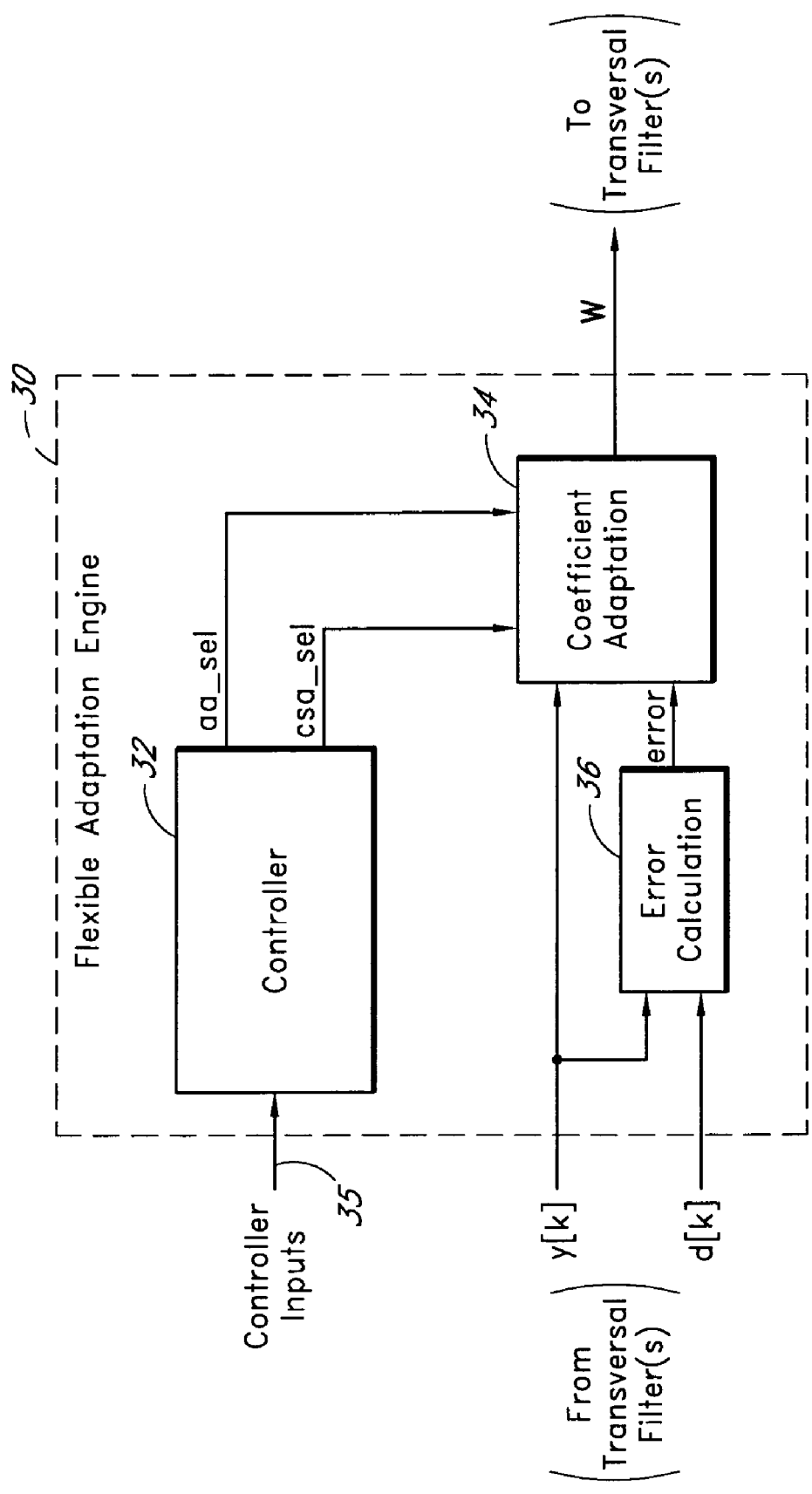
FIG. 4 is a block diagram of an adaptation engine according to one embodiment of the invention.

FIG. 4 is a top-level block diagram of a flexible adaptation engine 30 according to one embodiment of the invention. In this embodiment, a conventional adaptation engine 22 is augmented in-part with a controller block ("controller") 32 to provide increased flexibility. As described below, the controller 32 and the Coefficient Adaptation circuit 34 may be implemented in application-specific hardware, software executed by a processor (or a cluster of processors), or a combination thereof.

The controller 32 generates a signal csa_sel to select the filter coefficients to be adapted by a Coefficient Adaptation block or circuit 34. An important feature of the design is that the controller 32 can vary the number of coefficients that are selected for concurrent adaptation. For example, during one adaptation cycle, the controller 32 may select most or all of the transversal filter's coefficients for adaptation, and on another adaptation cycle, the controller may select a smaller subset of the filter's coefficients. Selection of a relatively small subset of coefficients may be desirable, for example, in order to reduce the load on the processor or other circuit that adapts the coefficients, and/or to reduce the time required to adapt the selected set of coefficients. As described below, one or more different coefficient selection algorithms may be implemented by the controller 32 to select the coefficients to adapt.

As illustrated in FIG. 4, the controller 32 also preferably generates a signal aa_sel to specify the adaptation algorithm(s) to be applied to the selected coefficients. Although many different adaptation algorithms can be used, in practice it is contemplated that the Coefficient Adaptation circuit 34 will implement only a small number (e.g., 2, 3 or 4) of adaptation algorithms. The design may alternatively be implemented such that only a single adaptation algorithm is used, or such that the Coefficient Adaptation circuit 34 selects the adaptation algorithm to use based on the number of coefficients selected. In a generalized form, any adaptation algorithm implemented within the Coefficient Adaptation circuit 34 can be applied to any coefficient of the transversal filter 20 at a given time.

In the illustrated embodiment, the controller 32 accepts a set of inputs 35 that can vary depending on the application. For example, one or more inputs may be provided for allowing a user to manually select the adaptation engine's mode of operation. The input signals to the controller 32 may also include control signals from other components, such as the Coefficient Adaptation circuit 34.

Figure 3:
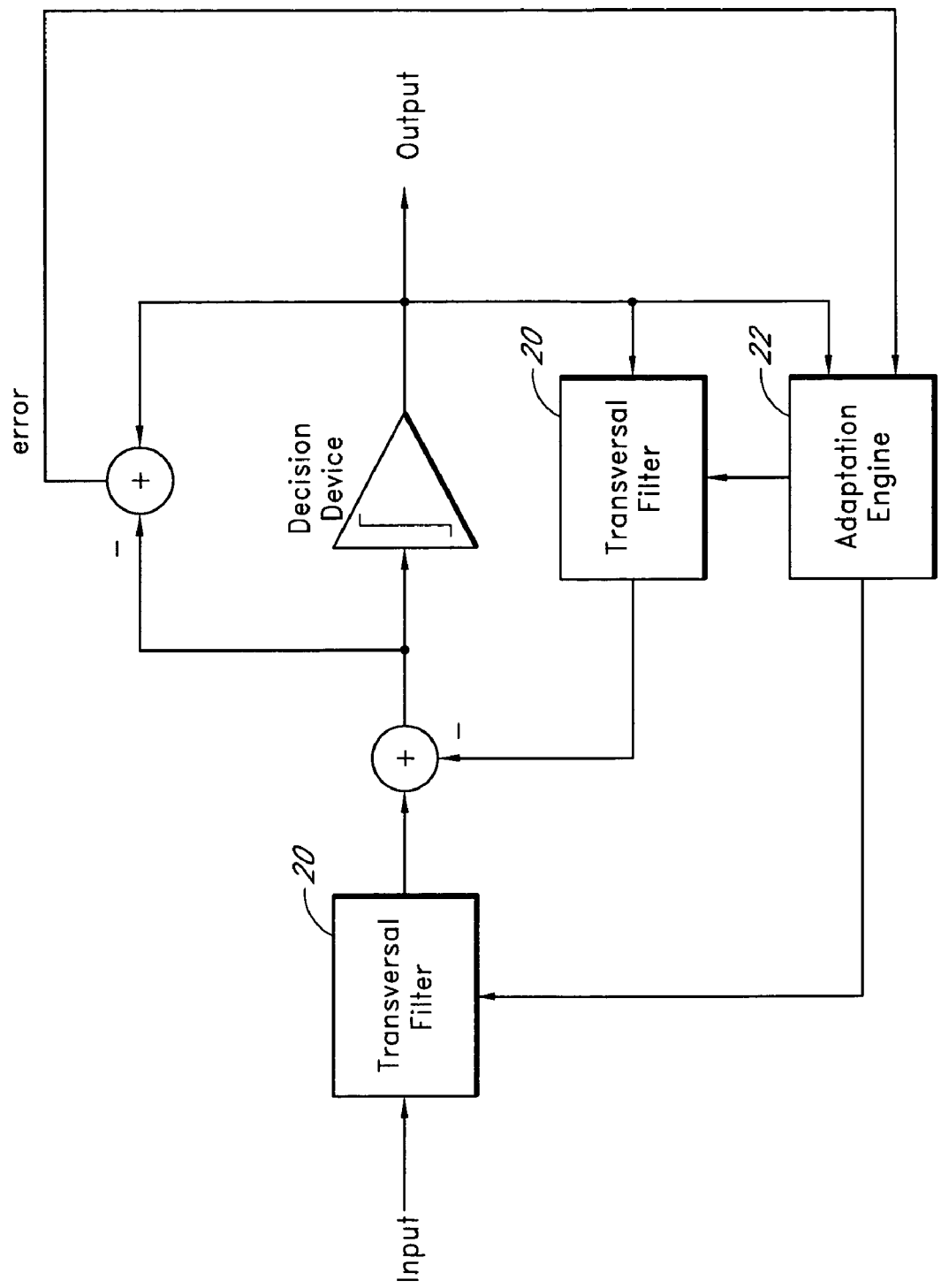
FIG. 3 is a block diagram of a prior art decision-directed DFE.
Figure 6:
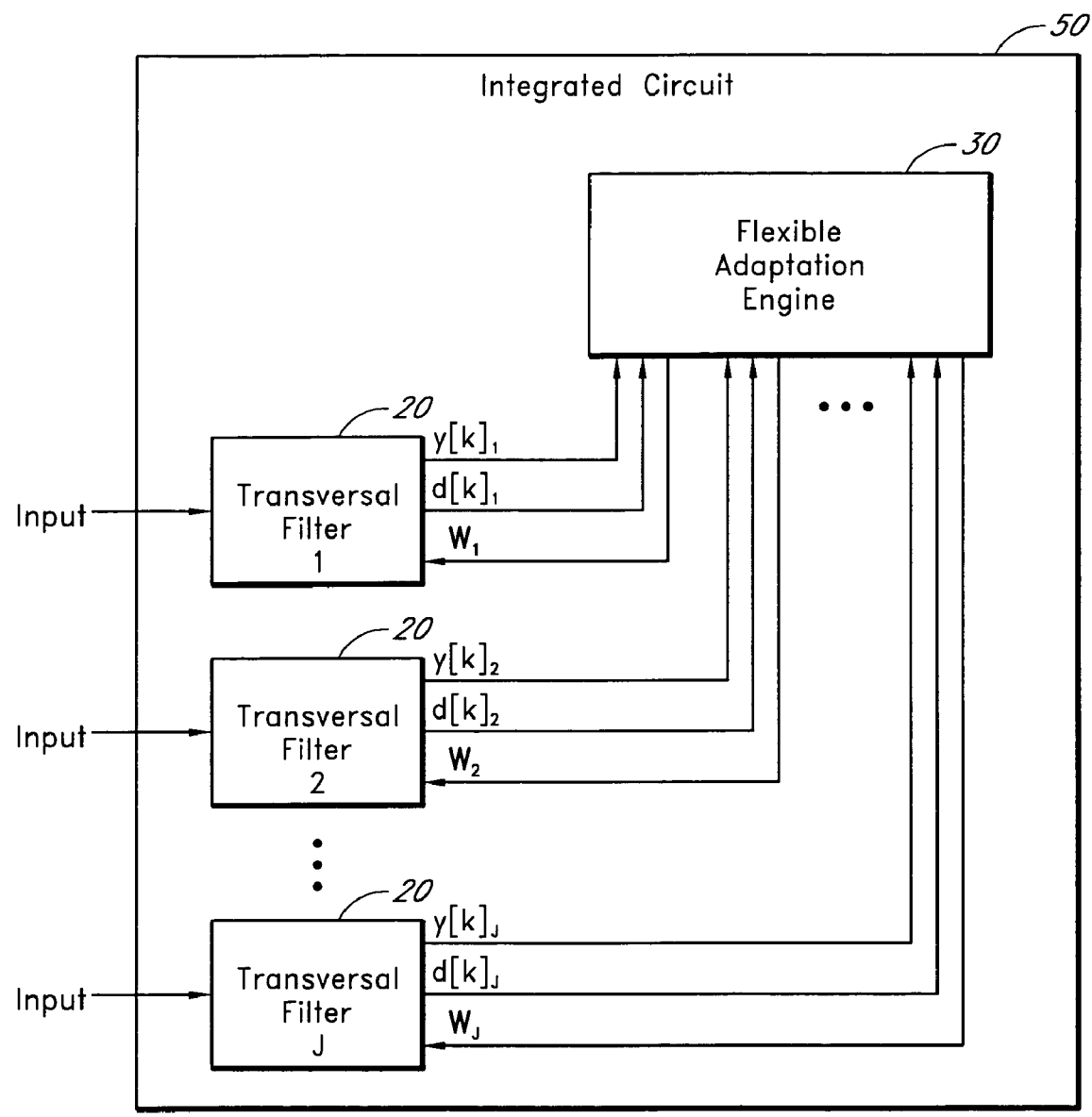
FIG. 6 illustrates an embodiment in which the flexible adaptation engine of FIG. 4 adapts the filters of a set of J transversal filters that are integrated with the adaptation engine within a single integrated circuit.

The filter output, y[k], and desired response, d[k], can come from any transversal filter 20, allowing a single adaptation engine 30 to operate on multiple transversal filters 20. For example, the flexible adaptation engine 30 may be used in place of the adaptation engine of FIG. 3, in which case the flexible adaptation engine 30 will receive y[k] and d[k] signals from, and provide updated filter coefficients to, both transversal filters 20 of the illustrated DFE. A generalized block diagram showing how a single flexible adaptation engine 30 may service multiple transversal filters 1-J is shown in FIG. 6 and is discussed below. The number of taps or coefficients N of each transversal filter 20 is typically in the range of 2-128, and more typically is in the range of 10-128.

The error calculation circuit 36 may be identical to a state of the art implementation, and therefore will not be described in detail. In blind equalization applications, the error calculation circuit 36 is not used, as the desired response, d[k], is unknown.

Some or all of the functionality of the controller 32 and the Coefficient Adaptation circuit 34 may be implemented within software executed by a digital signal processor or microprocessor circuit. This digital signal processor or microprocessor (generally "processor") may also execute software that is not part of the adaptation process. For example, the same processor that implements the coefficient adaptation algorithm(s) may also implement the associated transversal filter or filters 20, and possibly other types of filters. In such cases, the current load on the processor may be taken into consideration in determining how many filter coefficients are to be adapted concurrently during the next adaptation cycle, and/or in selecting the coefficient adaptation algorithm(s) to be used to adapt these coefficients.

Controller

The controller 32 can be constructed in a hardware circuit and/or in the form of software that runs on a digital signal processor or a microprocessor. The controller's primary function is to select the coefficients to be adapted, and optionally the adaptation algorithm(s) to be applied thereto, by the Coefficient Adaptation circuit 34. The controller 32 may use any one or more of the following algorithms (and/or other algorithms) to select the coefficients to be adapted: (1) a weighted selection algorithm in which some coefficients (such as those that are the most dominant and thus have the greatest impact) are adapted more often than others, (2) a sub-sampled selection algorithm in which there are times that no coefficients are being adapted, (3) a random coefficient selection algorithm, (4) a group selection algorithm in which different subsets of coefficients are adapted at a given time, (5) a sequential selection algorithm in which a single coefficient is adapted at a time, and all coefficients are rotated through in a cyclical manner (this is a specific instance of the group selection algorithm). The above algorithms can be appropriately combined with one another to produce other viable alternatives.

The controller 32 can also select from a wide variety of adaptation algorithms. The adaptation algorithms may include some or all of the following, algorithms, as well as others: (1) a least mean squares (LMS) algorithm, (2) a recursive least squares (RLS) algorithm, (3) a Constant Modulus algorithm (CMA). These are but a few of the many well known adaptation algorithms that may be used. The partial-update LMS algorithms described in the prior art overlap with a combination of the sequential coefficient selection and the LMS adaptation algorithm.

In practice, only a few different coefficient selection algorithms and adaptation algorithms will typically be used within a given implementation of the adaptation engine 30. In addition, a certain coefficient selection algorithm may be associated with a certain adaptation algorithm, as some combinations might not result in convergence.

Those skilled in the art will recognize that a variety of different input signals and criteria may be used to drive the controller 32 to achieve a variety of objectives. Some examples of possible input signals and criteria include, but are not limited to, the following: (1) manual control signals, (2) convergence status signals from the Coefficient Adaptation circuit 34, (3) clock recovery status signals from an external block, (4) signals containing information about the filter input, such as frequency and amplitude content, (5) the bit error rate (BER) in a data recovery system, (6) the steady-state performance of the transversal filter's coefficients (e.g., how much they chatter), (7) power consumption of the various circuits, (8) processor load. Any one or more of these criteria may be used to select subsets of coefficients to be adapted, and/or to select an adaptation algorithm to be used to adapt one or more selected coefficients.

By way of specific example, the controller 32 may implement a training mode to select a coefficient-selection algorithm and/or an adaptation algorithm that produces the "best" results. The following is one example of how such a training mode may be used to train a receiver that includes an adaptive transversal filter 20 and flexible adaptation engine 30 according to the invention.

1. Transmit a known, repeating pattern to the receiver and attempt to recover the data.
2. Apply coefficient-selection algorithm X and adaptation algorithm Y.
3. Measure BER of recovered data.
4. Repeat steps 1-3 using various combinations of available coefficient-selection algorithms and adaptation algorithms, each time measuring and recording the resulting BER.
5. Choose the coefficient-selection algorithm/adaptation algorithm combination that gives the best BER.

Various other criteria may be used in combination with, or in place of, BER to measure the performance of the receiver. In addition, rather than using a known, repeating pattern, CRC (cyclic redundancy code) and/or ECC (error correction code) values within the transmitted data stream may be used to determine the BER, such that training may be performed during normal operation of the receiver. Further, the above process may be modified to permit different subsets of a filter's coefficients to be adapted concurrently using different respective adaptation algorithms.

Once a particular coefficient-selection algorithm/adaptation algorithm pair has been selected for use (step #5), this pair may be used unless and until some event occurs that causes the training process (steps 1-5 above) to be repeated. Examples of such triggering events may include the following: (1) degradation of the BER below a selected threshold; (2) a switch to a different operating channel or frequency; (3) user activation of a button or switch that initiates the training process; (4) an increase in processing load (e.g., CPU utilization) above a particular threshold, (5) detection of a "battery low" signal or a "low power mode signal." In the case of (4) and (5), a less computation-intensive coefficient-selection algorithm/adaptation algorithm pair may be temporarily selected for use to reduce processing load and/or power consumption attributable to coefficient adaptation operations.

Coefficient Adaptation Circuit

Figure 5:
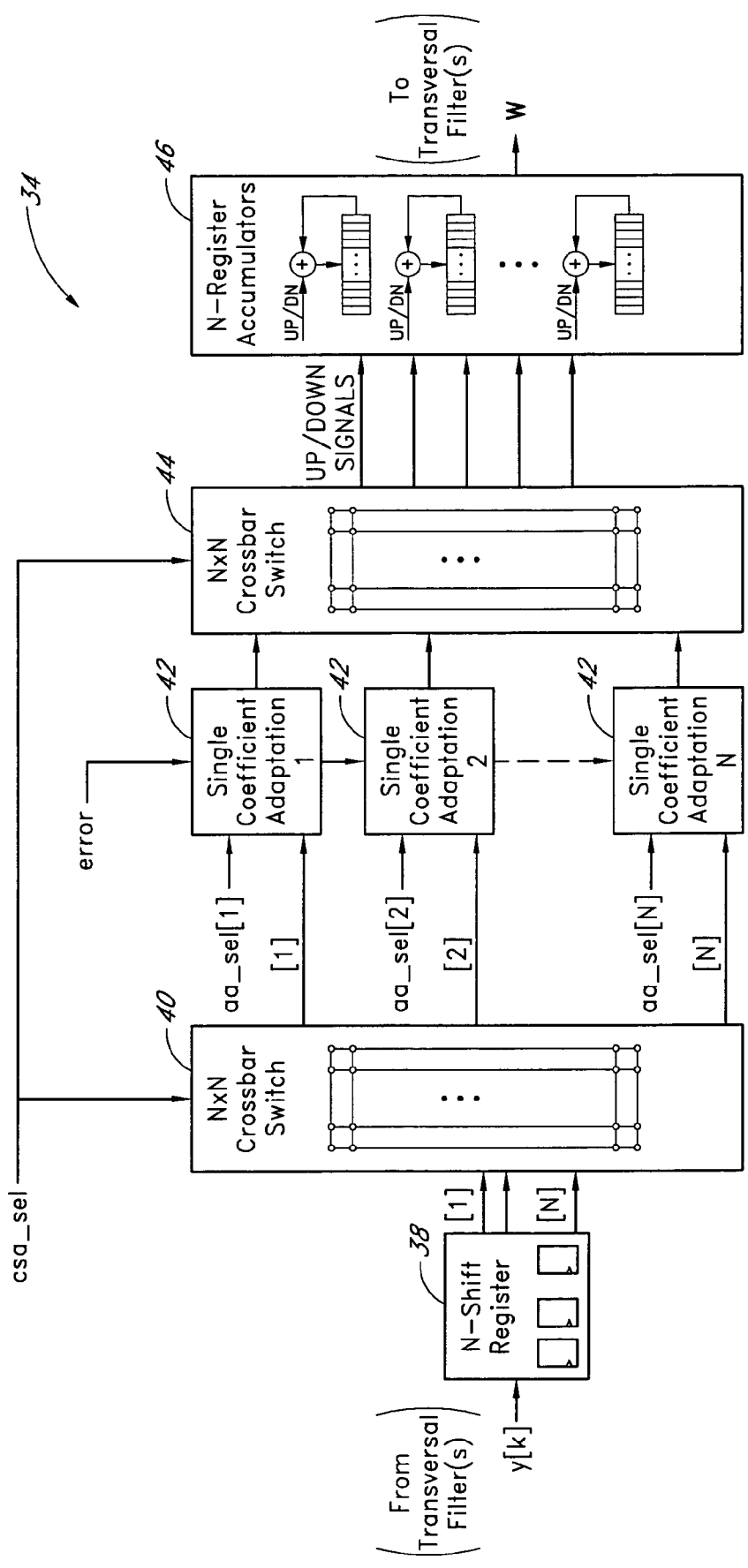
FIG. 5 illustrates one embodiment of the coefficient adaptation block of FIG. 4.

The Coefficient Adaptation circuit 34 can be in the form of a hardware circuit, and/or can be implemented as a processor (such as a digital signal processor or general purpose microprocessor circuit) that executes software. A generalized block diagram is shown in FIG. 5 for an N-coefficient system.

An N-shift register 38 receives the serial output signal y[k] of a transversal filter 20, and converts this signal into parallel form. The parallel version of the y[k] signal is fed to a first N×N crossbar switch 40, which allows a generalized mapping of any coefficient to any one of N Single Coefficient Adaptation (SCA) blocks or components 42, as dictated by the csa_sel signal. The SCA components 42 generate up/down signals that are used to adjust the corresponding filter coefficients upward and downward from their values. The second N×N crossbar switch 44 maps the outputs of the SCA components 42 to the correct accumulators in an N-register accumulator bank 46. Both crossbar switches are controlled by the signal csa_sel, which may be a multi-bit signal.

Each of the N registers in the accumulator bank 46 stores a single coefficient. The set of N coefficients currently stored in the accumulator bank 46 may represent the coefficient vector W currently in use by a corresponding transversal filter 20. Each accumulator operates generally by adjusting its respective coefficient value in response to the up and down signals received from the second N×N crossbar switch 44. If the flexible adaptation engine 30 services multiple N-tap filters 20, a separate N-register accumulator bank 46 may be provided for each such filter. Although the coefficients are stored digitally in the illustrated embodiment, they may alternatively be stored using analog memory elements.

The Single Coefficient Adaptation (SCA) components 42 are very flexible in the generalized form, allowing for selection of any adaptation algorithm. Thus, different adaptation algorithms can be applied to different coefficients concurrently. All of the operations associated with the various adaptation algorithms (multiplications, additions, averaging, etc.) are preferably performed by the SCA components 42. Common error calculation functions can be moved into the Error Calculation component 36 (FIG. 4) at the top level. To enable the adaptation engine 30 to operate on subsets of coefficients, the SCA components 42 also preferably have a disable option selectable by the respective aa_sel signals.

Thus, by controlling the two crossbar switches 40, 44 and selecting appropriate adaptation algorithms in the illustrated embodiment, the controller 32 (FIG. 4) can update any subset of a traversal filter's coefficients at a given time. In addition, different mutually-exclusive subsets of coefficients can be updated concurrently using different respective adaptation algorithms. For example, the controller 32 can select a first subset of one or more filter coefficients to update using a first adaptation algorithm, while selecting a second subset of one or more filter coefficients to concurrently update using a second adaptation algorithm. This may be desirable where some of the parameters being adapted have different properties or requirement than others. For example, if the first coefficient of a transversal filter 20 is the most dominant (and therefore the most important), it may be desirable to apply a more computationally intensive (and reliable) adaptation algorithm to this coefficient than to the filter's other coefficients.

In other embodiments, the controller 32 may be capable of selecting coefficients to update with a lesser degree of flexibility. For instance, the number of coefficients that may be updated at a time may be fixed, or may be limited to certain values (e.g., 2, 4, 8, . . . ). In addition, certain rules or restrictions may be imposed for governing which coefficients may be updated concurrently. Further, as mentioned above, the controller 32 need not be capable of selecting an adaptation algorithm to be applied.

In pure software implementations, the functionality of the crossbar switches 40, 46, the SCA components 42, the selection signals csa_sel and aa_sel, and the accumulator bank 46 may be implemented in software. Multiple instances of the code used to implement the SCA components 42 may be executed in parallel to permit different coefficients to be adapted concurrently, optionally based on different adaptation algorithms.

In a basic implementation, the Coefficient Adaptation circuit 34 may include one or two available adaptation algorithms and a simplified version of the mapping function. For example, in one embodiment, the single coefficient partial-update LMS algorithm described in the prior art is implemented by making the following simplifications: (1) the first crossbar switch 40 is replaced with an N:1 multiplexer, (2) only one SCA component 42 is provided, (3) the second crossbar switch 44 is replaced with a 1:N demultiplexer, and (4) only a single accumulator in the N-accumulator bank 46 (the valid output of the demultiplexer) is updated at a given time.

FIG. 6 depicts an embodiment in which the flexible adaptation engine 30 services multiple transversal filters 1-J on a time-shared basis. The transversal filters 20 and the flexible adaptation engine 30 are implemented entirely in hardware on a single integrated circuit (IC) 50, which may be an FPGA, an ASIC, or another type of custom IC. In this embodiment and the other embodiments in which a single flexible adaptation engine 30 services multiple filters 20, the filters may be distributed across multiple, separate data transmission channels that are generally independent of each other; this is in contrast to the prior art DFE design shown in FIG. 3, in which the two transversal filters are part of the same data transmission channel.

Figure 7:
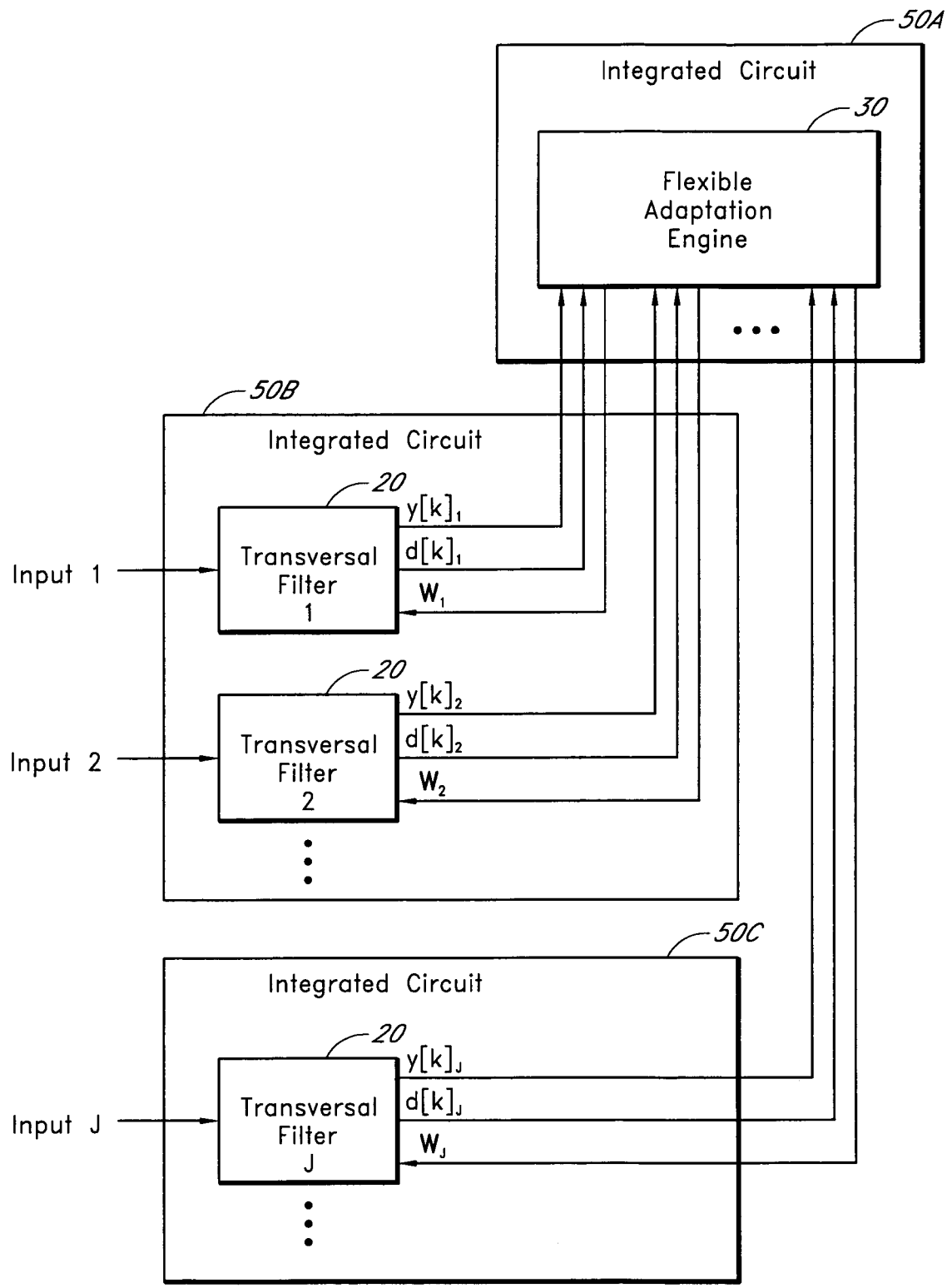
FIG. 7 illustrates an embodiment in which the transversal filters and the adaptation engine reside within separate integrated circuits.

Another hardware only embodiment (FIG. 7) shows how the various components can be placed on separate ICs, each of which can be an FPGA or a custom IC. In this embodiment, the flexible adaptation engine 30 resides within one IC 50A, and the transversal filters 20 it services reside within separate ICs 50B, 50C.

Figure 8:
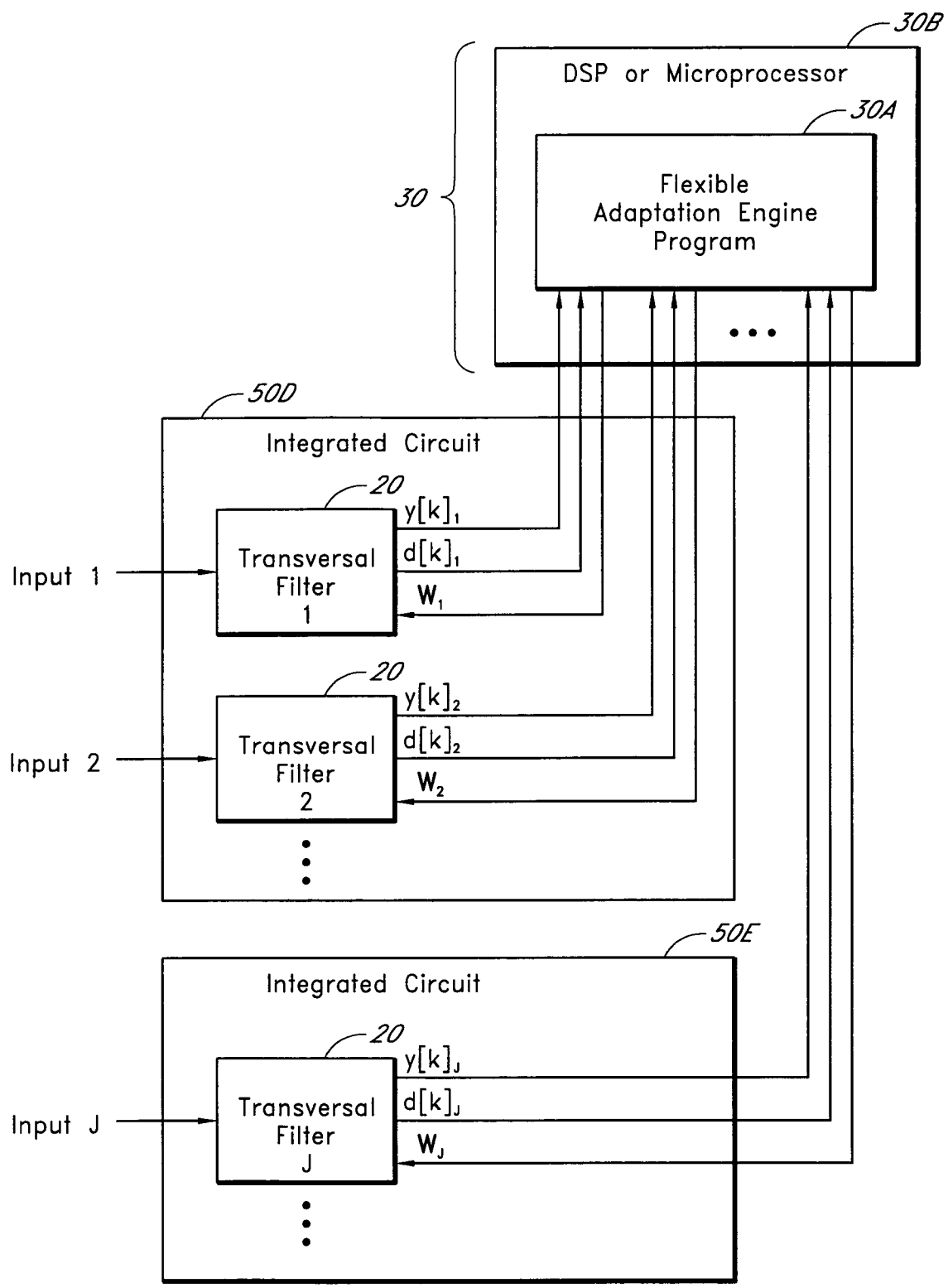
FIG. 8 illustrates an embodiment in which the adaptation engine is implemented within software executed by a digital signal processor or a microprocessor.

FIG. 8 illustrates an embodiment in which the flexible adaptation engine 30 is implemented in software 30A executed by a processor 30B. The processor 30B is preferably either a digital signal processor (DSP) or a general purpose microprocessor. In this example, the flexible adaptation engine 30 again services multiple transversal filters 20 that are spread across multiple ICs 50D, 50E. In addition to implementing the controller and coefficient adaptation algorithms described herein, the processor 30B may implement various other algorithms associated with the transversal filters 20. For example, as a variation of the design shown in FIG. 8, some or all of the transversal filters 20 may be implemented in software executed by the processor 30B.

Various other approaches are also possible. For example, the controller logic for selecting coefficients to adapt and/or selecting adaptation algorithms may be implemented in software, while the logic for adapting the selected coefficients may be implemented purely in hardware.

Figure 1:
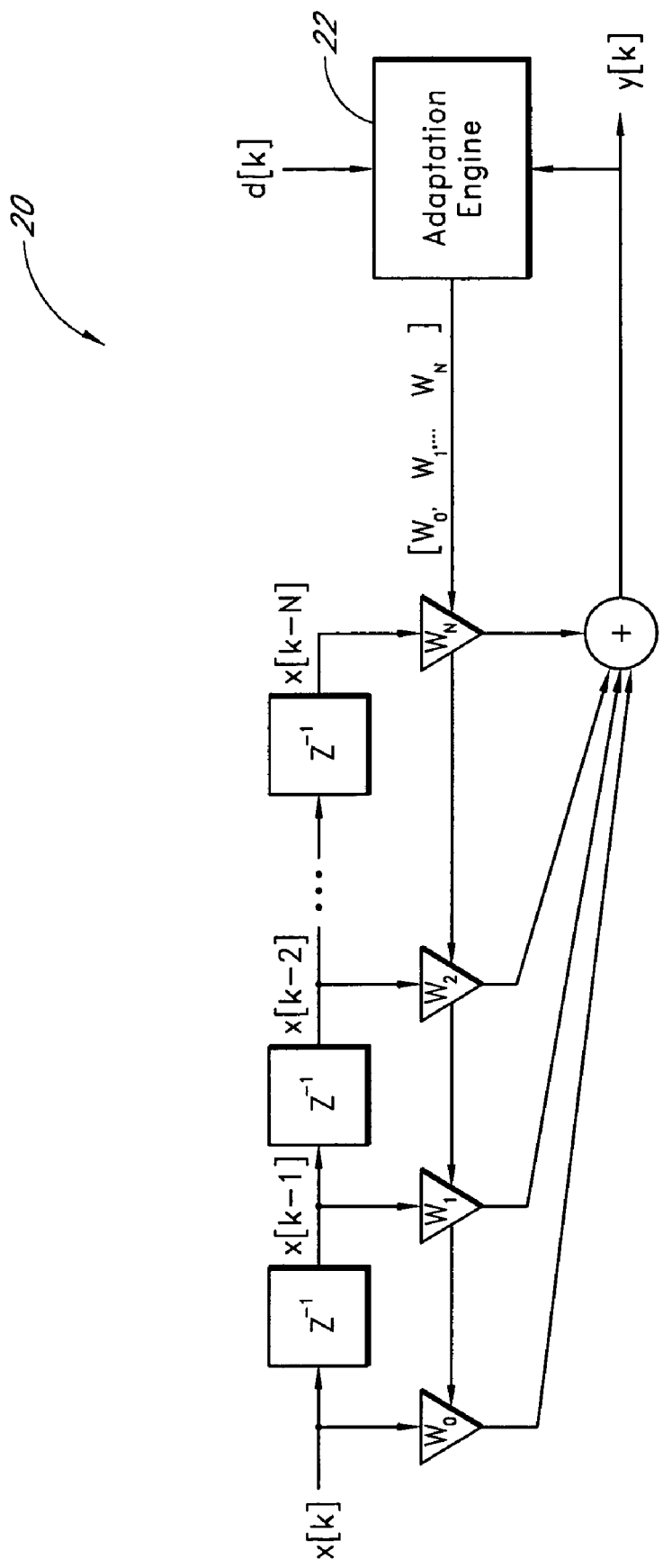
FIG. 1 is a block diagram of a prior art adaptive traversal filter.
Figure 2:
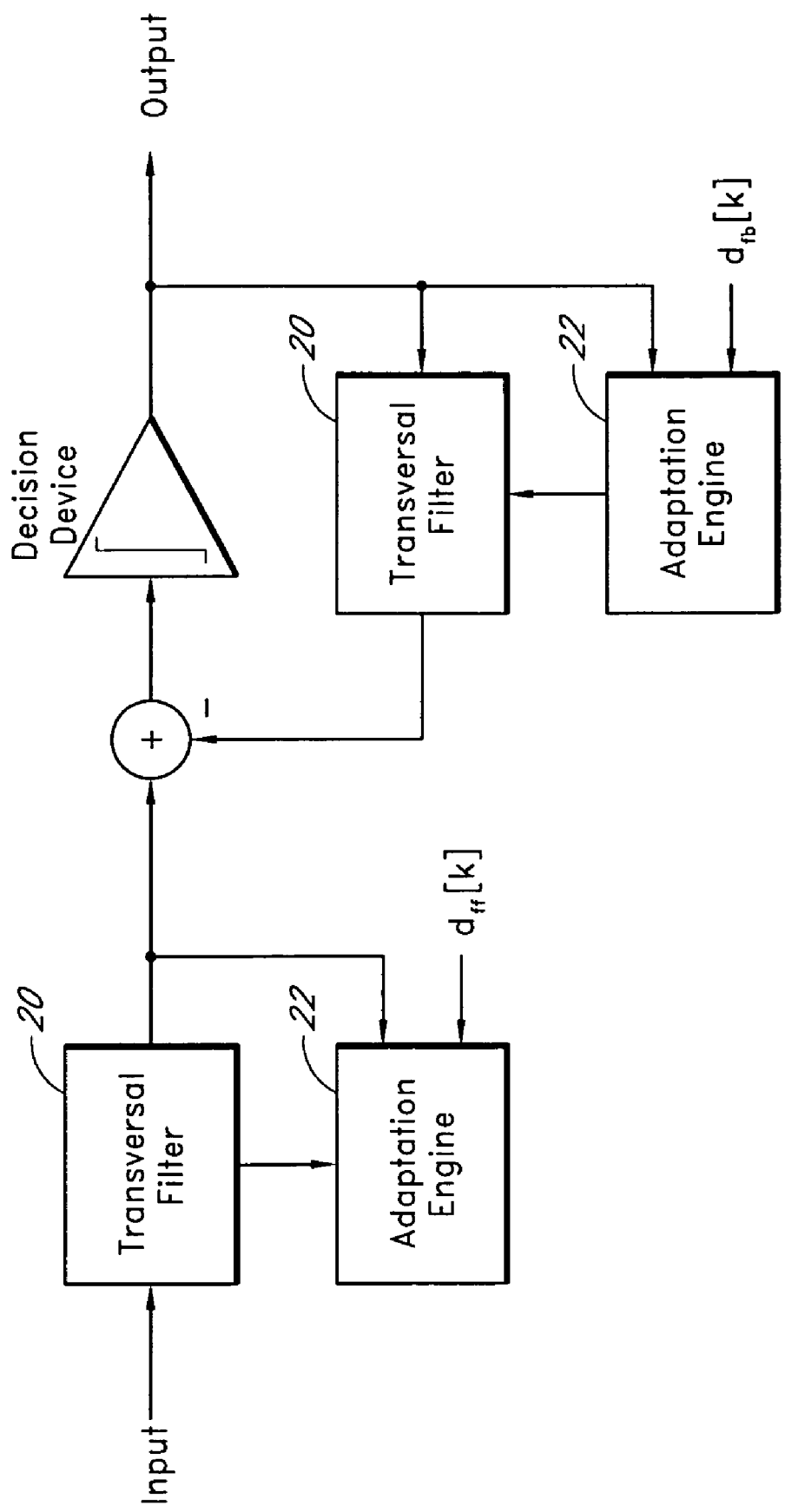
FIG. 2 is a block diagram of a prior art adaptive Decision Feedback Equalizer (DFE).
Figure 9:
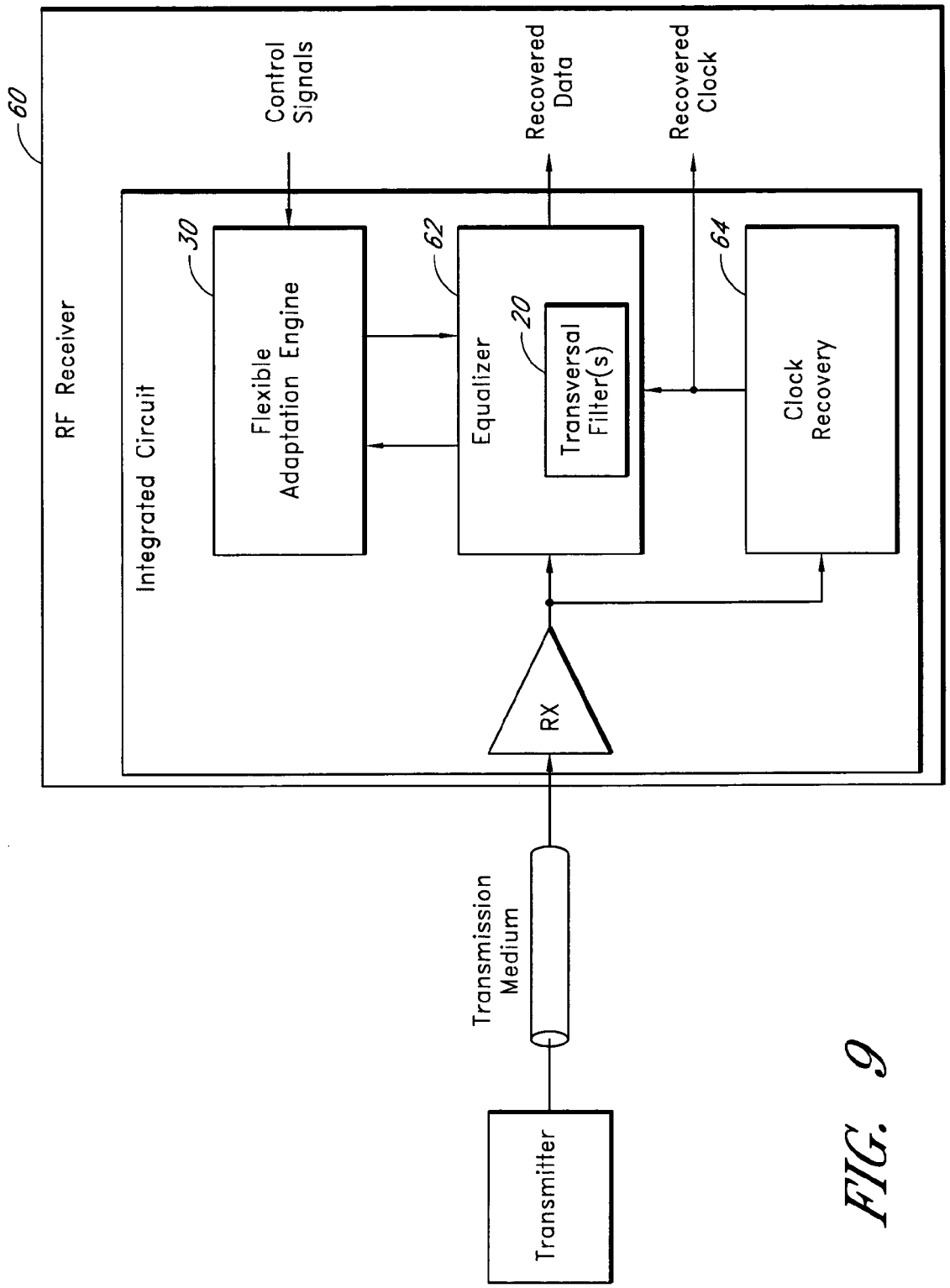
FIG. 9 illustrates a receiver system in which the flexible adaptation engine is used to adapt the coefficients of one or more transversal filters of an equalizer.

FIG. 9 illustrates a typical configuration in which the flexible adaptation engine 30 is incorporated into a receiver 60, as might be done in a wireless, backplane, cable, or pc-board data transmission system. In this embodiment, the flexible adaptation engine adapts the coefficients of one or more transversal filters 20 of an equalizer 62. The equalizer 62, may, for example, be a decision feedback equalizer (DFE) of the type shown in FIG. 2 or 3, or may be a fractionally spaced equalizer. The recovered data signal from the equalizer 62, and/or the recovered clock signal generated by a clock recovery circuit 64, may be provided directly or indirectly as control signals to the flexible adaptation engine 30, as described above, and used to select the coefficients to adapt and/or the adaptation algorithm(s) to use.

As will be recognized, the above-described embodiments may be combined with each other, and with the prior art systems described herein, to generate various additional embodiments. For example, the features of any one embodiment may be incorporated into any of the other disclosed embodiments.

It will also be recognized that the flexible adaptation engine design disclosed herein can also be used to adapt system variables other than filter coefficients. For example, the flexible adaptation engine design can also be used to adapt such parameters as receiver gain, recovered clock phase, offset correction variables, transmitter pre-emphasis, and transmitter swing. Thus, although the design is described in the context of digital filters, it is not so limited.

Although this invention has been disclosed in the context of certain preferred embodiments and examples, it will be understood by those skilled in the art that the present invention extends beyond the specifically disclosed embodiments to other alternative embodiments and uses of the invention and obvious modifications and equivalents thereof. Accordingly, the invention is defined only by the claims that follow.

What is claimed is:

1. An adaptation engine for adapting coefficients of a digital filter, the adaptation engine comprising:
a coefficient adaptation circuit coupled to the digital filter, said coefficient adaptation circuit implementing a plurality of coefficient adaptation algorithms to adapt the coefficients of the digital filter; and
a controller that controls the coefficient adaptation circuit at least in part by selecting coefficients of the digital filter to adapt, and by adaptively selecting specific coefficient adaptation algorithms of said plurality of coefficient adaptation algorithms to use to adapt the selected coefficients, wherein a different coefficient adaptation algorithm is adaptively selected at least partially in response to a bit error rate (BER).

2. The adaptation engine of claim 1, wherein the coefficient adaptation circuit is capable of concurrently applying different coefficient adaptation algorithms to different coefficients of the digital filter.

3. The adaptation engine of claim 1, wherein the coefficient adaptation circuit comprises a plurality of single coefficient adaptation circuits that operate in parallel to permit multiple coefficients to be updated concurrently, wherein the controller separately specifies the coefficient adaptation algorithm to be applied by each single coefficient adaptation circuit such that different coefficients of the digital filter may be updated concurrently using different respective coefficient adaptation algorithms.

4. The adaptation engine of claim 1, wherein the coefficient adaptation circuit is capable of concurrently adapting each coefficient of the digital filter using a different respective adaptation algorithm.

5. The adaptation engine of claim 1, wherein the plurality of coefficient adaptation algorithms includes a least mean square adaptation algorithm and a recursive least squares adaptation algorithm.

6. The adaptation engine of claim 5, wherein the plurality of coefficient adaptation algorithms further includes a constant modulus adaptation algorithm.

7. The adaptation engine of claim 1, wherein the controller implements a plurality of different coefficient selection algorithms to select coefficients of the digital filter to adapt.

8. The adaptation engine of claim 1, wherein the controller selects coefficients to adapt at least in part using a weighted selection algorithm in which some coefficients of the digital filter are adapted more often than others.

9. The adaptation engine of claim 1, wherein the controller selects coefficients to adapt at least in part using a coefficient selection algorithm in which the number of coefficients of the digital filter that are adapted at a time varies over time.

10. The adaptation engine of claim 1, wherein the controller selects coefficients to adapt at least in part using a random selection algorithm.

11. The adaptation engine of claim 1, wherein the controller adaptively selects among the plurality of coefficient adaptation algorithms based at least in part by monitoring the bit error rate of the digital filter to assess an effectiveness of each such coefficient adaptation algorithm.

12. The adaptation engine of claim 1, wherein the controller further selects among the plurality of coefficient adaptation algorithms based at least in part on a current load on a processor that implements the coefficient adaptation algorithms and other algorithms associated with the digital filter.

13. The adaptation engine of claim 1, wherein the coefficient adaptation circuit comprises a processor which executes software.

14. The adaptation engine of claim 1, wherein the coefficient adaptation circuit is implemented within application-specific hardware.

15. The adaptation engine of claim 1, wherein the coefficient adaptation circuit is coupled to, and adapts the coefficients of, a first digital filter that is part of a first data transmission channel, and a second digital filter that is part of a second data transmission channel, said second data transmission channel being separate from the first data transmission channel.

16. The adaptation engine of claim 1, wherein the digital filter is a transversal filter.

17. The adaptation engine of claim 1, wherein the controller is further configured to apply said plurality of coefficient selection algorithms, to measure a bit error rate for said plurality of coefficient selection algorithms, and to adaptively select a coefficient selection algorithm based at least partially by bit error rate.

18. A receiver system, comprising:
a receiver that receives a transmitted signal;
an equalizer that receives the transmitted signal from the receiver and processes the transmitted signal using a digital filter, said digital filter characterized by a plurality of filter coefficients; and
an adaptation engine that adapts the plurality of filter coefficients over time using a plurality of different coefficient adaptation algorithms, wherein the adaptation engine comprises a controller that adaptively selects a smaller subset than all of said plurality of coefficients to adapt, and adaptively selects a coefficient adaptation algorithm from said plurality of adaptation algorithms to use to adapt said adaptively selected smaller subset of filter coefficients.

19. The receiver system of claim 18, wherein the adaptation engine is capable of concurrently applying different coefficient adaptation algorithms to different coefficients of the digital filter.

20. The receiver system of claim 18, wherein the adaptation engine is capable of concurrently adapting each coefficient of the digital filter using a different respective adaptation algorithm.

21. The receiver system of claim 18, wherein the plurality of coefficient adaptation algorithms includes a least mean square adaptation algorithm and a recursive least squares adaptation algorithm.

22. The receiver system of claim 21, wherein the plurality of coefficient adaptation algorithms further includes a constant modulus adaptation algorithm.

23. The receiver system of claim 18, wherein the controller implements a plurality of different coefficient selection algorithms to select coefficients of the digital filter to adapt.

24. The receiver system of claim 18, wherein the controller selects coefficients to adapt at least in part using a weighted selection algorithm in which some coefficients are adapted more often than others.

25. The receiver system of claim 18, wherein the controller selects coefficients to adapt at least in part using a coefficient selection algorithm in which the number of coefficients of the digital filter that are adapted at a time varies over time.

26. The receiver system of claim 18, wherein the controller selects coefficients to adapt at least in part using a random selection algorithm.

27. The receiver system of claim 18, wherein the controller adaptively selects between the plurality of coefficient adaptation algorithms based at least in part by monitoring an operation of the digital filter to assess an effectiveness of each such coefficient adaptation algorithm.

28. The receiver system of claim 18, wherein the receiver system comprises a plurality of digital filters, each of which has filter coefficients that are updated by the adaptation engine.

29. The receiver system of claim 28, wherein the plurality of digital filters comprises a first digital filter that is part of a first data transmission channel, and a second digital filter that is part of a second data transmission channel, said second data transmission channel being separate from the first data transmission channel.

30. The receiver system of claim 18, wherein the digital filter is a transversal filter.

31. The receiver system of claim 18, wherein the equalizer is a decision feedback equalizer.

32. The receiver system of claim 18, wherein the adaptation engine is further configured to adaptively select a size of the smaller subset and/or the coefficient selection algorithm for the smaller subset based at least partially on a switch to a different operating frequency.

33. The receiver system of claim 18, wherein the adaptation engine is further configured to adaptively select a size of the smaller subset based at least partially on a current load of a processor performing the coefficient adaptation.

34. The receiver system of claim 33, wherein the adaptation engine is further configured to adaptively select the coefficient adaptation algorithm for the smaller subset based on the number of coefficients selected for adaptation.

35. A method of updating filter coefficients of a digital filter, the method comprising:
    filtering interference using the digital filter to compensate for the effects of a transmission channel;
    adaptively selecting a first subset of the filter coefficients of the digital filter based at least in part on a current load of a processor adapting the first subset of filter coefficients;
    adapting the first subset of filter coefficients using a first adaptation algorithm;
    selecting a second subset of the filter coefficients of the digital filter, said second subset being different from the first subset; and
    adapting the second subset of filter coefficients using a second adaptation algorithm that is different from the first adaptation algorithm;
    wherein the first subset of coefficients is more dominant than the second subset of filter coefficients, and the first adaptation algorithm is more computation-intensive than the second adaptation algorithm.

36. The method of claim 35, wherein the first and second subsets of filter coefficients are adapted concurrently.

37. The method of claim 35, wherein the first and second subsets of filter coefficients each consist of a single respective filter coefficient.

38. The method of claim 35, wherein the first and second subsets of filter coefficients and the first and second adaptation algorithms are selected by a controller that monitors the operation of the digital filter.

39. The method of claim 35, wherein the first and second subsets are different in size.

40. The method of claim 35, wherein the digital filter is a transversal filter.

41. An adaptation engine which operates according to the method of claim 31, the adaptation engine embodied within computer hardware.

42. The method of claim 35, wherein adaptively selecting the first subset is also based at least partially on a determination of a "battery low" condition.

43. An adaptation engine for adapting coefficients of a digital filter, the adaptation engine comprising:
    a coefficient adaptation circuit coupled to the digital filter, said coefficient adaptation circuit implementing at least one coefficient adaptation algorithm to adapt the coefficients of the digital filter; and
    a controller that controls the coefficient adaptation circuit at least in part by adaptively selecting fewer than all coefficients of the digital filter to adapt, wherein the controller implements at least one coefficient selection algorithm in which different numbers of the adaptively selected coefficients of the digital filter can be adapted during different adaptation cycles.

44. The adaptation engine of claim 43, wherein the controller varies the size of a group of filter coefficients that are selected for concurrent adaptation based at least in part on a load level of the coefficient adaptation circuit.

45. The adaptation engine of claim 43, wherein the controller implements a plurality of different coefficient selection algorithms.

46. The adaptation engine of claim 43, wherein the controller selects the coefficients such that a dominant coefficient of the digital filter is adapted more frequently than other coefficients of the digital filter.

47. The adaptation engine of claim 43, wherein the coefficient adaptation circuit implements a plurality of coefficient adaptation algorithms.

48. The adaptation engine of claim 47, wherein the controller selects between the plurality of adaptation algorithm such that a more computation-intensive adaptation algorithm is applied to a dominant coefficient than is applied to other coefficients of the digital filter.

49. The adaptation engine of claim 47, wherein the controller selects specific coefficient adaptation algorithms from said plurality based at least in part on performance data reflective of performance of the digital filter.

50. The adaptation engine of claim 43, wherein the coefficient adaptation circuit comprises a processor that executes program instructions.

51. The adaptation engine of claim 43, wherein the digital filter is a transversal filter.

52. An equalizer circuit that comprises the adaptation engine of claim 43.

53. An adaptation engine for adapting coefficients of a digital filter, the adaptation engine comprising:
    a coefficient adaptation circuit coupled to the digital filter, said coefficient adaptation circuit implementing a plurality of coefficient adaptation algorithms to adapt the coefficients of the digital filter; and
    a controller that controls the coefficient adaptation circuit at least in part by selecting coefficients of the digital filter to adapt, and by adaptively selecting specific coefficient adaptation algorithms of said plurality of coefficient adaptation algorithms to use to adapt the selected coefficients, wherein a different coefficient adaptation algorithm is adaptively selected at least partially in response to status signals obtained from clock recovery unit.

54. An adaptation engine for adapting coefficients of a digital filter, the adaptation engine comprising:

a coefficient adaptation circuit coupled to the digital filter, said coefficient adaptation circuit implementing a plurality of coefficient adaptation algorithms to adapt the coefficients of the digital filter; and a controller that controls the coefficient adaptation circuit at least in part by selecting coefficients of the digital filter to adapt, and by adaptively selecting specific coefficient adaptation algorithms of said plurality of coefficient adaptation algorithms to use to adapt the selected coefficients, wherein a different coefficient adaptation algorithm is adaptively selected at least partially in response to a status of clock recovery.

* * * * *